United States Patent [19]

Knox et al.

[11] Patent Number: 4,858,818
[45] Date of Patent: Aug. 22, 1989

[54] METHOD OF BONDING A MAGNETOSTRICTIVE SHEET TO A SHAFT

[75] Inventors: Lawrence D. Knox, Milford, Mass.; Izrail Tsals, Princeton Junction, N.J.

[73] Assignee: Caterpillar Inc., Peoria, Ill.

[21] Appl. No.: 228,132

[22] Filed: Aug. 4, 1988

[51] Int. Cl.$^4$ .......................... G01L 3/10; B23K 1/12; B23K 1/20; B23K 31/02

[52] U.S. Cl. ..................................... 228/164; 228/155; 228/179; 228/187; 228/263.11; 228/263.15; 73/862.36; 73/DIG. 2

[58] Field of Search ...................... 228/173.2, 179, 187, 228/263.11, 263.15, 155, 164; 73/862.36, DIG. 2

[56] References Cited

U.S. PATENT DOCUMENTS

| | | | |
|---|---|---|---|
| 3,340,729 | 9/1967 | Scoppe | 73/136 |
| 4,016,519 | 4/1977 | Haas | 336/200 |
| 4,075,591 | 2/1978 | Haas | 336/200 |
| 4,100,794 | 7/1978 | Meixner | 73/136 A |
| 4,106,334 | 8/1978 | Studtmann | 73/136 A |
| 4,117,438 | 9/1978 | Kim et al. | 336/75 |
| 4,135,391 | 1/1979 | Dahle | 73/136 A |
| 4,193,048 | 3/1980 | Nyhus | 333/26 |
| 4,306,462 | 12/1981 | Meixner | 73/862.36 |
| 4,340,833 | 7/1982 | Sudo et al. | 310/268 |
| 4,364,278 | 12/1982 | Horter et al. | 73/862.36 |
| 4,374,433 | 2/1983 | Ogawa et al. | 369/136 |
| 4,406,168 | 9/1983 | Meixner | 73/862.36 |
| 4,414,855 | 11/1983 | Iwasaki | 73/862.36 |
| 4,414,856 | 11/1983 | Winterhoff | 73/862.36 |
| 4,503,714 | 3/1985 | Winterhoff | 73/862.36 |
| 4,506,554 | 3/1985 | Blomkvist et al. | 73/862.36 |
| 4,523,482 | 6/1985 | Barkhoudarian | 73/862.36 |
| 4,566,338 | 1/1986 | Fleming et al. | 73/862.36 |
| 4,572,005 | 5/1986 | Kita | 73/862.36 |
| 4,589,290 | 5/1986 | Sugiyama et al. | 73/862.36 |
| 4,627,298 | 12/1986 | Sahashi et al. | 73/862.36 |
| 4,712,433 | 12/1987 | Hochstein et al. | 73/862.36 |
| 4,724,710 | 2/1988 | Murty | 73/862.36 |

FOREIGN PATENT DOCUMENTS

| | | | |
|---|---|---|---|
| 42628 | 3/1985 | Japan | 73/862.36 |
| 79241 | 5/1985 | Japan | 73/862.36 |
| 200138 | 10/1985 | Japan | 73/862.36 |
| WO88/00690 | 1/1988 | PCT Int'l Appl. | |

Primary Examiner—Nicholas P. Godici
Assistant Examiner—Samuel M. Heinrich
Attorney, Agent, or Firm—Michael G. Fletcher; Robert E. Muir; Wei Wei Jeang

[57] ABSTRACT

A method is provided for use with non-contacting torque sensors. Many torque sensors use a sheet of magnetostrictive material wrapped about the shaft whose torque is to be measured. The methods used to wrap and affix the sheet of magnetostrictive material induce a prestress into the sheet, which leads to early saturation of the magnetostrictive material. The prestress diminishes the useful range of the torque sensor. As a solution, a method is provided for bonding a magnetostrictive material sheet to a shaft while minimizing stress of the magnetostrictive sheet. By bending a magnetostrictive material sheet and a carrier sheet about the mandrel and bonding the sheets together at a first preselected temperature, cooling them to form a cylinder having a magnetostrictive material outer layer and a carrier inner layer, and bonding the cylinder to a shaft at a second predetermined temperature, the stresses induced in the magnetostrictive sheet are minimized.

6 Claims, 8 Drawing Sheets

Fig_4_

Fig_6_

Fig_8_

Fig_9_

Fig_11

FIG. 13.

```
┌─────────────────────────────────────┐
│ BEND MAGNETOSTRICTIVE MATERIAL      │
│ SHEET TO A PRESELECTED RADIUS       │
│ OF CURVATURE                        │
└─────────────────────────────────────┘
                  ↓
┌─────────────────────────────────────┐
│ BEND NONFERROMAGNETIC MATERIAL SHEET│
│ OVER THE MAGNETOSTRICTIVE SHEET TO  │
│ THE PRESLECTED RADIUS OF CURVATURE  │
└─────────────────────────────────────┘
                  ↓
┌─────────────────────────────────────┐
│ BOND THE NONFERROMAGNETIC SHEET TO  │
│ THE MAGNETOSTRICTIVE SHEET AT A     │
│ FIRST PRESELECTED TEMPERATURE       │
└─────────────────────────────────────┘
                  ↓
┌─────────────────────────────────────┐
│ COOL THE BONDED MATERIAL TO FORM A  │
│ CYLINDER HAVING AN OUTER LAYER OF   │
│ MAGNETOSTRICTIVE MATERIAL AND AN    │
│ INNER LAYER OF NONFERRMAGNETIC      │
│ MATERIAL                            │
└─────────────────────────────────────┘
                  ↓
┌─────────────────────────────────────┐
│ BOND THE CYLINDER TO A SHAFT AT A   │
│ SECOND PRESELECTED TEMPERATURE      │
└─────────────────────────────────────┘
```

METHOD OF BONDING A MAGNETOSTRICTIVE SHEET TO A SHAFT

TECHNICAL FIELD

This invention relates generally to an apparatus for measuring the torque applied to a shaft and more particularly to an apparatus for measuring torque using magnetic properties of a torque transmitting member.

BACKGROUND OF THE INVENTION

Many sensors utilize the magnetic properties of magnetostrictive materials to sense torque. Such materials change their magnetic permeability in response to stress, making them ideal for use in a non-contacting torque sensor arrangement. A magnetic field is passed through the magnetostrictive material. The magnetic field propagation changes as the permeability of the stressed magnetostrictive material changes. This permeability change is measured and related to the torque needed to cause such a stress.

U.S. Pat. No. 3,340,729 issued to Scoppe on Sept. 12, 1967, discloses a torque sensor which has a magnetostrictive layer affixed to a nonmagnetic shaft. This patent contains information concerning basic properties of torque sensing using magnetostrictive materials and flux inducing coils. It was intended to overcome drawbacks in the art associated with shafts made of magnetostrictive material. Other torque sensors have improved on this basic concept. U.S. Pat. No. 4,414,855 issued to Iwasaki on Nov. 15, 1983, discloses a torque sensor that uses a strip or strips of magnetostrictive material affixed helically at 45. to a nonmagnetic shaft to reduce inconsistent stresses in the material. U.S. Pat. No. 4,506,554 issued to Blomkvist et al. on Mar. 26, 1985 discloses two zones of slotted magnetostrictive material attached to a shaft.

All of these have inherent shortcomings. Firstly, magnetic flux permeates ferromagnetic materials, such as are typically found in drive shafts and the like. When a magnetostrictive material is bonded to a shaft made of a ferromagnetic material, flux changes may take place in the shaft as well as in the magnetostrictive material. This leads to inaccurate torque measurements. Secondly, if shafts are made from nonferromagnetic materials, the shafts may not meet the requirements for rugged applications. Nonferromagnetic materials are generally weaker and more expensive to produce, as compared to hardened steel shafts. Moreover, affixing a layer of magnetostrictive material to a shaft induces a prestress in the material. The accompanying circuitry may adjust to the prestress, but the range of measurement will be limited since the material reaches saturation under a smaller amount of stress. Even further, the means by which a magnetostrictive material layer is affixed to a shaft effects the sensor's durability and accuracy.

U.S. Pat. Nos. 4,414,856 and 4,503,714 issued to Winterhoff on Nov. 15, 1983, and Mar. 12, 1985, respectively, disclose a magnetostriction torque sensor which uses a shaft made of a magnetostrictive material. Windings on a soft magnetic core induce magnetic flux into the shaft. As the shaft changes its magnetic permeability in response to torque, a measuring head outputs a signal relative to a flux change caused by the changing permeability. U.S. Pat. No. 4,566,338 issued to Fleming et al. on Jan. 28, 1986 discloses another sensor which uses a shaft made of a magnetostrictive material.

These torque sensors display various problems. Shafts of magnetostrictive material are often expensive and difficult to manufacture. Additionally, a bulky piece of magnetostrictive material possesses irregularities which produce inaccurate results.

A magnetic source induces a magnetic flux into the magnetostrictive material of torque sensors of this type, thus providing a non-contacting arrangement for sensing torque. Most of the above-mentioned patents disclose some type of structure for inducing a magnetic flux. Typically a magnetic coil structure having a number of poles surrounds the magnetostrictive material on the shaft. U.S. Pat. Nos. 4,100,794, 4,306,462, and 4,406,168 issued to Meixner on July 18, 1978, Dec. 22, 1981, and Sept. 27, 1983, respectively, disclose circular cores having pole pieces. A primary core induces a magnetic flux into an adjacent shaft. A pair of secondary cores measure changes in magnetic flux caused by magnetic permeability changes in the magnetostrictive material under stress. A low frequency AC source drives the primary core to which the secondary cores are inductively coupled. The secondary cores output to a signal processing circuit which determines any changes in flux between the induced and measured values. U.S. Pat. No. 4,106,334 issued to Studtmann on Aug. 15, 1978 discloses the magnetic core structure of Meixner with a bifilarly wound primary winding. U.S. Pat. No. 4,135,391 issued to Dahle on Jan. 23, 1979 discloses a core arrangement having a primary core arranged perpendicular to the secondary core.

Many problems plague core assemblies such as these. Severe environments inflict much damage to the cores. Oils, vibration, dirt, and temperature greatly reduce their accuracy and lives. The core assemblies also occupy a relatively large amount of space. When attempting to install a torque sensor in an engine or transmission housing, or in any other location having limited area, the physical size of the sensor is extremely critical. Moreover these cores require much raw material. A magnetic core covered by many meters of copper wire represents a significant portion of the total torque sensor cost.

The sheer size of the core structures makes maintaining a consistent air gap between the shaft and the core troublesome. U.S. Pat. No. 4,572,005 issued to Kita on Feb. 25, 1986 and U.S. Pat. No. 4,589,290 issued to Sugiyama et al. on May 20, 1986 disclose mountings which use a bearing structure to maintain a given clearance. However bearings wear out and also cause some damage to the shaft.

The present invention is directed to overcoming one or more of the problems as set forth above.

THE DISCLOSURE OF THE INVENTION

In one aspect of the present invention a method is provided for bonding a magnetostrictive sheet to a shaft while minimizing stress of the magnetostrictive sheet. A magnetostrictive material sheet is bent about a mandrel having a preselected radius. A nonferromagnetic material sheet is bent about the mandrel and over the magnetostrictive sheet. The layers are bonded together at a first preselected temperature to form a bonded material sheet. The bonded material sheet is cooled to form a cylinder having an outer layer of magnetostrictive material and an inner layer of nonferromagnetic material.

The cylinder is bonded to a cylindrical shaft at a second predetermined temperature.

The technology relating to torque sensors, while quite comprehensive, still leaves many unsolved problems. While the prior art has attempted to address these problems, the problems still remain. Industry desires a durable, inexpensive, accurate, non-contacting torque sensor, but often one of these desirable features is sacrificed for another. For instance, magnetostrictive material bonded to a nonferromagnetic shaft leads to an accurate torque sensor, but the shaft is expensive. The nonferromagnetic material provides a barrier to magnetic flux. This keeps the majority of the flux in the magnetostrictive sheet for greater accuracy. This problem is solved by providing a sheet of nonferromagnetic material between the magnetostrictive material and the shaft. This shields the shaft from the magnetic flux regardless of the shafts composition. Additionally, the range of the torque sensor is extended by minimizing the stress in the magnetostrictive material during the bonding process.

BEST MODE FOR CARRYING OUT THE INVENTION

Figures 1, 2, 3:
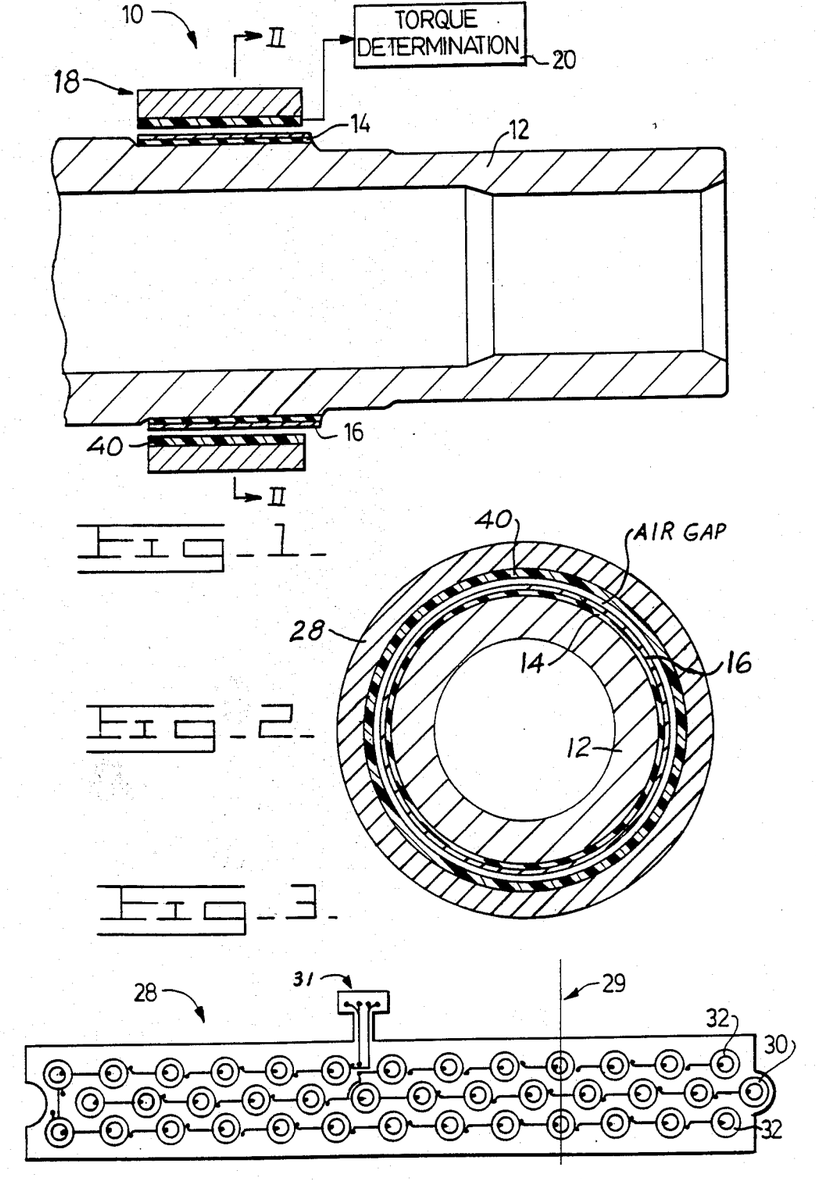
FIG. 1 is a longitudinal section of a shaft and illustrating a sensor circumjacent the shaft.
FIG. 2 is the view along lines II—II of FIG. 1.
FIG. 3 illustrates a flexible sensor structure.

FIGS. 1 and 2 illustrate an apparatus 10 for sensing the torque applied to a shaft 12. The shaft may be either ferromagnetic, such as steel, or nonferromagnetic, such as stainless steel or graphite. Bonded about the shaft 12 is a sheet of non-ferromagnetic material 14. Bonded about the non-ferromagnetic sheet 14 is a sheet of magnetostrictive material 16. Magnetostrictive material changes its magnetic permeability in response to stress. A means 18 senses a change in magnetic permeability of the magnetostrictive material sheet. This change corre-lates to the stress, or in this case torque, applied to the magnetostrictive material. A means 20 determines the torque applied to the shaft in response to a sensed change in magnetic permeability of the magnetostrictive material sheet 16. The nonferromagnetic sheet 14 shields the shaft 12 from magnetic flux. Therefore, when the means 18 senses a change in magnetic permeability of the magnetostrictive sheet 16, the magnetic properties of the shaft 12 do not interfere.

Figure 4:
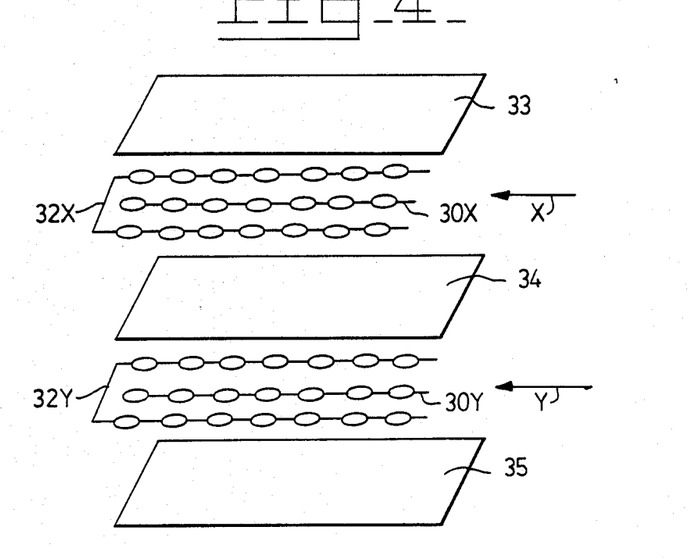
FIG. 4 is an exploded view of the flexible sensor structure.
Figure 7:
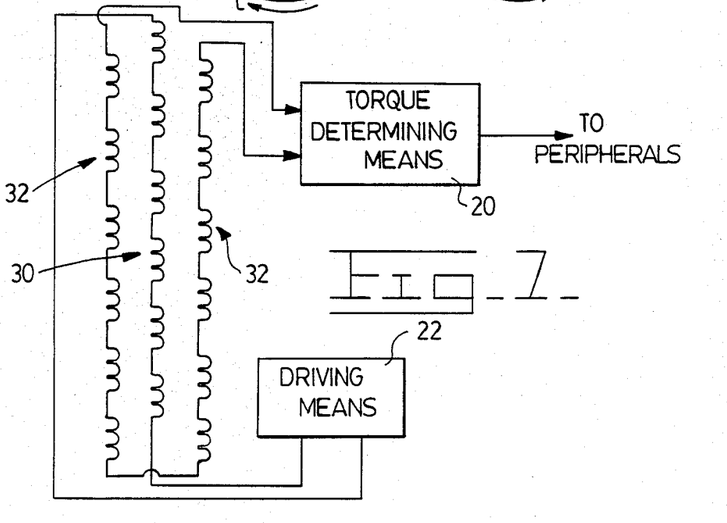
FIG. 7 is a schematic and functional block diagram of a processing circuit.

Referring now to FIGS. 3, 4 and 7 a preferred sensor structure is shown. The sensing means 18 preferably includes means 22,30 for inducing an alternating magnetic flux in the magnetostrictive material sheet 16. Once a magnetic flux is induced in the magnetostrictive material sheet 16, any change in the permeability of the sheet 16 produces a change in the magnetic flux distribution in the sheet 16. The sensing means 18 senses an alternating magnetic flux in the magnetostrictive sheet 16. The sensing means 18 is preferably an inductive coil structure 28 disposed concentrically at a predetermined distance about the shaft. The coil structure 28 advantageously includes a plurality of series connected primary coils 30 which are driven by alternating current having a preselected magnitude and a preselected frequency. The coil structure 28 further advantageously includes a plurality of series connected secondary coils 32 disposed on each side of the primary coils 30. Preferably each secondary coil 32 lies along an imaginary line 29 which perpendicularly bisects respective primary coils 30. This coil arrangement provides a differential signal including directional information for positive and negative torque measurements.

Although the coil structure 28 may take any of a number of forms, such as those disclosed in the U.S patents listed in previous sections, advantageously the coil structure 28 is relatively thin and flexible. Manufacturing a flexible coil structure 28 as a flat ribbon leads to ease of fabrication and installation. A flexible base sheet 34 of a material having no magnetic properties, typically an insulator such as plastic, has a first and second side. As shown in FIG. 4, a first plurality of inductive coils X are disposed on the first side of the flexible base sheet 34. The coils X are "wound" planar with the base sheet 34 in alternating clockwise and counterclockwise directions, and are referred to in the art as printed circuit coils. The coils X are made from an electrically conducting material, such as copper. The copper is disposed on the base sheet 34 using a common etching process known in the art of printed circuit board fabrication and not described further herein. A second like plurality of planar inductive coils Y are disposed on the second side of the base sheet 34. The primary coils 30X on the first side are aligned with the primary coils 30Y on the second side. Likewise, the secondary coils 32X on the first side are aligned with the secondary coils 32Y on the second side. The alignment effectively doubles the turns of each coil, which in turn doubles the flux density emanating from the coils perpendicular to the base sheet 34. A typical number of turns for each coil is seven for each primary coil 30 and ten for each secondary coil 32. Since the primary coils 30 are being powered, the crossectional area of the copper trace of the primary coils 30 is usually larger than the crossectional area of the copper trace of the secondary coils 32. Hence, the primary coils 30 usually have fewer turns per unit area as compared to the secondary coils 32. To protect the coils 30,32, first and second flexible cover sheets 33,35 of a material having no magnetic properties are bonded to the first and second sides of the base sheet 34, respectively. The flexible material used is preferably of the type used in flexible printed circuit boards, such as that sold by the E. I. du Pont de Nemours & Co. Inc. under the trade name KAPTAN. The flexible coil structure 28 provides a small, efficient means for inducing and sensing magnetic flux in the sheet 16. To augment sensitivity, coils with more effective turns can be made by simply making more layers of coils.

Figures 5A, 5B:
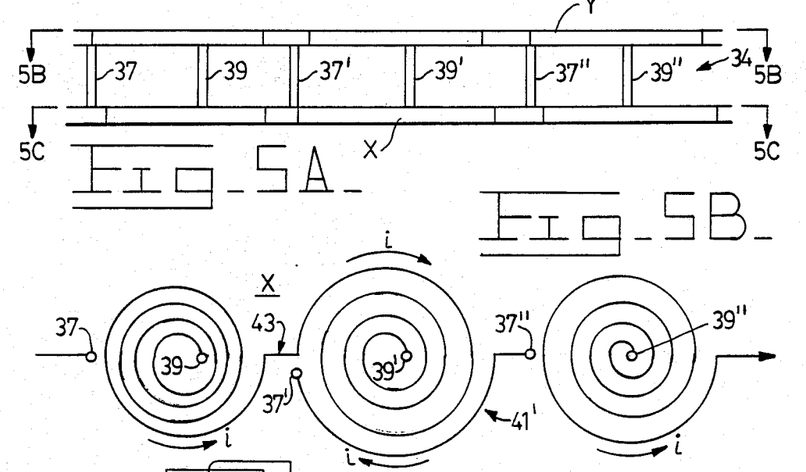
FIG. 5A is a detailed view of a portion of the flexible sensor structure.
FIGS. 5B and 5C are detailed plan views of the coils as seen from lines 5B—5B and 5C—5C, respectively, in FIG. 5A.
Figure 5C:
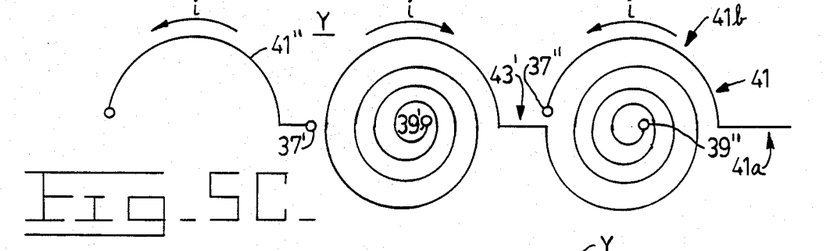

The structure and interconnection of the individual coils optimizes performance while minimizing electrical interference. FIG. 5A shows a crossectional view of the coils X and Y disposed on the flexible base sheet 34. Interconnection channels 37,39 connect the copper trace of a coil X to the copper trace of coil Y. FIGS. 5B and 5C show a top view of the coils X and Y as taken along lines B and C, respectively. The copper trace of a coil X starts at interconnection channel 39 and spirals outwardly in a counterclockwise direction until the desired number of turns is reached. The copper trace straightens for a predetermined distance to form a connection portion 43, then begins to spiral inwardly in a clockwise direction ending at interconnection channel 39' to form another coil X with the desired number of turns. The copper trace then continues through interconnection channel 39', as shown in FIG. 5C, and spirals outwardly in the clockwise direction to form a coil X. This essentially aligns the coil X with the coil Y to form a primary or secondary coil 30,32 having a clockwise sense. The copper trace straightens for a predetermined distance to form another connection portion 43', then begins to spiral inwardly in a counterclockwise direction ending at interconnection channel 39" to form another coil Y with the desired number of turns. The copper trace from this coil Y continues through interconnection channel 39" and spirals outwardly in a counterclockwise direction to form another coil X over the coil Y. This process is repeated to form all of the primary and secondary coils 30,32, respectively, while keeping interconnections between coils to a minimum.

Referring to FIGS. 5B and 5C, the return path portions 41 of the copper trace offer distinct advantages. As stated previously, all of the primary coils are connected in series, and all of the secondary coils are connected in series. The copper trace is continuous for each set of coils 30,32. The copper trace begins at the terminal 31, forms the serially connected coils as described above, and returns to the terminal 31. A return path brings the copper trace back to the terminal 31 after all of the coils are formed.

The return path portions 41 are designed to achieve four basic goals. Firstly, the return path portions 41a follow the outline of the coils in such a manner that they contribute to the sensitivity of the coils. The direction of the alternating current, i, is shown in FIGS. 5B and 5C. The return path portions 41a not only follow the outer contour of a portion of the coils, but they also carry current in the same direction as the coils. In order to accomplish this, the return path portions 41 advantageously alternate between sides A and B by using interconnection channels 37. Secondly, the return path portions do not cause unwanted magnetic interference when crossing one another or when crossing a connection portion 43. While the return path portions 41a following the outer contour of the coils 30,32 carry current in the same direction as the coils, the return path portions 41b that extend between each coil 30,32 carry current in directions opposite to one another. Therefore, the return path portions 41b cancel the magnetic effects of the current through connection portions 43, so they do not interfere with the flux in the coils. Thirdly, the return path allows for the construction of a coil structure that does not form a current loop around the shaft. The ends of the flexible coil structure 28 are not electrically connected to one-another, so there is no flux path around the shaft, but rather into the shaft. Fourthly, the coil structure 28 is capable of being formed using only two layers of printed circuit coils, thus minimizing the thickness of the coil structure 28 while maintaining a relatively simple design. Moreover, the interconnections of the return path are kept to a minimum, while achieving the aforementioned functions.

Figure 6:
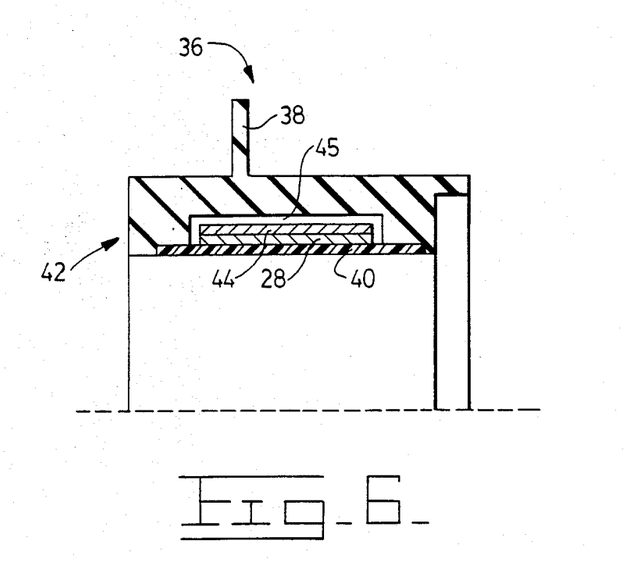
FIG. 6 illustrates a mounting structure for the flexible sensor structure.

FIG. 6 illustrates a mounting structure 36. The mounting structure 36 maintains the coil structure 28, or any similar sensor structure, concentrically at a predetermined distance about the shaft 12. The mounting structure includes a housing 38 which may be separate or integral with another housing, such as a transmission casing for example. A tube 40 having no magnetic or conductive properties, such as plastic tube, is concentrically disposed about the shaft 12 at a predetermined distance therefrom (see FIGS. 1 and 2). The flexible coil structure 28 is disposed about the tube 40. This further protects the coil structure 28 from possible damage and accurately positions it to maintain a precise gap between the shaft 12 and the coil structure 28. Typically, the flexible coil structure 28 is wrapped around the outside of the tube 40. A means 42 secures the tube and the coil structure 28 in the housing 38. Preferably the securing means 42 includes a yoke 44 which wraps around the coil structure 28 to fixedly hold it to the tube 40. The yoke 44 may also act as a "back iron" to conduct magnetic flux and provide a flux return path. For this purpose the yoke 44 is preferably made of a magnetostrictive ribbon or high permeability steel. Of course it is recognized that other means, such as the mounting structure 36, may also serve this purpose. Advantageously a potting compound, such as epoxy resin, fills the gap 45 between the yoke 44 and the housing 38. A potting compound effectively secures the coil structure 28 and any related components in the housing 38 even under extreme environmental conditions. Although the above is preferable, other means, such as clamps, screws, and pressed fittings, function also.

FIG. 7 is a schematic and functional block diagram of a circuit for the apparatus 10. The means 22 drives the primary coils 30 with alternating current having a preselected magnitude and a preselected frequency. The primary coils 30 induce an alternating magnetic flux into the magnetostrictive material sheet 16 in response to the alternating current. The secondary coils 32 sense an alternating magnetic flux in the magnetostrictive sheet 16. The means 20 determines the torque applied to the shaft 12 in response to a sensed change in magnetic permeability of the magnetostrictive material sheet 16. As the magnetic permeability of the magnetostrictive material changes in response to torque induced stress, the alternating magnetic field in the magnetostrictive material changes. This change is sensed by the secondary coils, and the torque determining means 20 compares the induced alternating magnetic flux with the sensed alternating magnetic flux, to determine the amount of change in the magnetic permeability of the magnetostrictive sheet 16. This comparison may or may not be carried out by means of a comparator circuit. For instance, the driving means 22 of the present invention incorporates feedback circuitry to closely control the frequency and magnitude of the induced alternating magnetic field. Therefore, the induced alternating magnetic field is "known" and does not need to be directly compared with the sensed alternating magnetic field. Instead the secondary coils 32 are connected differentially to the torque determining means 20. As the shaft 12 is stressed, the magnetic permeability change in the magnetostrictive sheet 16 causes a shift in the flux distribution about the secondary coils 32. The secondary coils 32 are preferably positioned along a line 29 perpendicularly bisecting respective primary coils 30. In this configuration, the flux pattern between adjacent primary coils 30, with no torque present, is equally divided between the associated secondary coils 32, so no differential voltage is present. As torque increases, the flux pattern changes causing the secondary coils 32 to sense a magnetic potential difference. A voltage differential appears between the secondary coils 32 having clockwise structures and those having counterclockwise structures. These voltage differentials are additive for each pair of secondary coils 32. For instance, if there are twenty-eight secondary coils, each oppositely wound pair having a voltage differential of X volts, the total differential voltage measured by the torque determining means is 14×volts. The driving means 22 accurately controls the induced flux to insure precise measurements of this kind.

Figure 8:
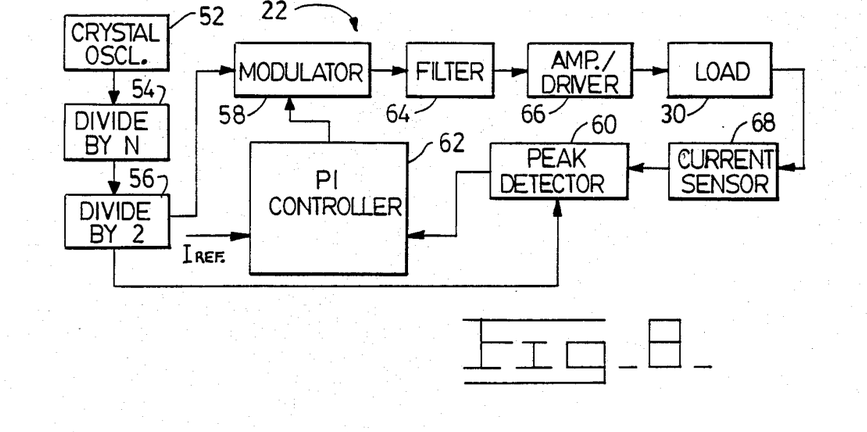
FIG. 8 is a functional block diagram of a driver circuit.

FIG. 8 is a functional block diagram of a preferred embodiment of the driving means 22. Accuracy of the apparatus is determined by many factors. Comparing the induced magnetic flux with the sensed magnetic flux affects overall accuracy. Variance of the induced flux causes inaccuracies in the comparison. Therefore, a driving means 22 for supplying alternating current having little variance is provided. As compared to other torque sensing systems, the driving means 22 uses a relatively high frequency, such as about 80K Hz, to limit flux penetration into the shaft 12 and to maximize induced voltage. To obtain an accurate preselected frequency, a crystal oscillator 53 produces a stable frequency reference. A divide-by-N circuit 54 and a divide-by-2 circuit 56 reduce the reference frequency to the preselected level. A modulator 58 receives the preselected frequency signal, as does a peak detector 60. The peak detector 60 samples the current through the primary coils 30, via a current sensor 68, and outputs a signal relative to the magnitude of the sensed current. The output signal from the peak detector 60 and a current reference signal, $I_{ref}$, which corresponds to the preselected magnitude of the alternating current, are delivered to a proportional integral controller 62. The proportional integral controller 62 develops an error signal which it delivers to the modulator 58 so as to vary the amplitude of the preselected frequency signal in the modulator 58 to reduce the error signal to zero. The output of the modulator 58 is a square wave amplitude modulated signal. A filter 64 converts the square wave amplitude modulated signal into a triangular amplitude modulated signal. This signal passes through an amplifier/driver 66 to provide the excitation to the primary coils 30. The inductance of the primary coils 30 suppresses the higher order harmonics, so a near sinusoidal current flows through the primary coils 30. The current through the primary coils 30 is sensed by a current sensor 68. The peak detector 60 provides the feedback to the proportional integral controller 62 in response to the sensed current signal and the current reference signal.

Figure 9:
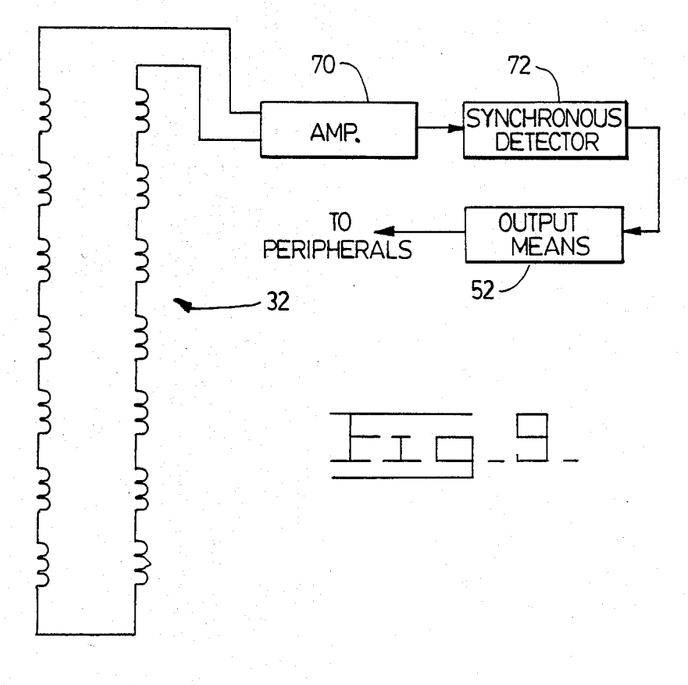
FIG. 9 is a schematic and functional block diagram of a torque determining circuit.
Figures 10A, 10B:
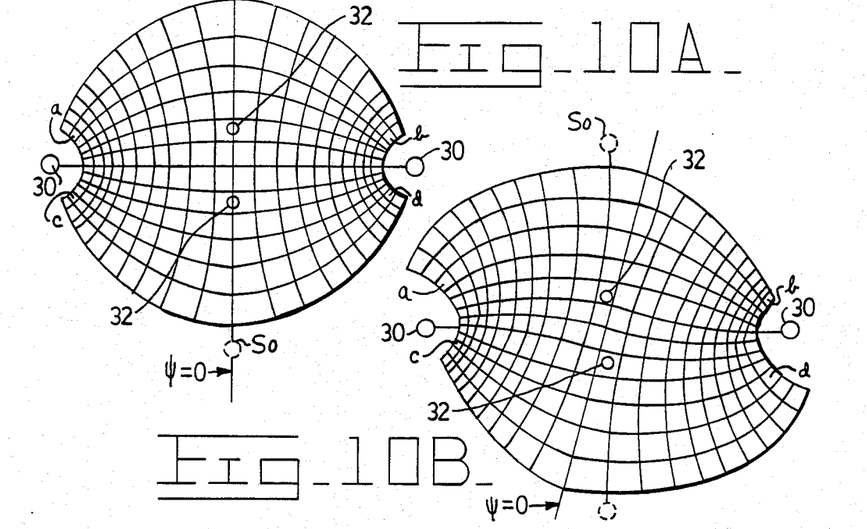
FIGS. 10A and 10B illustrate a magnetic flux distribution.
Figures 12A, 12B:
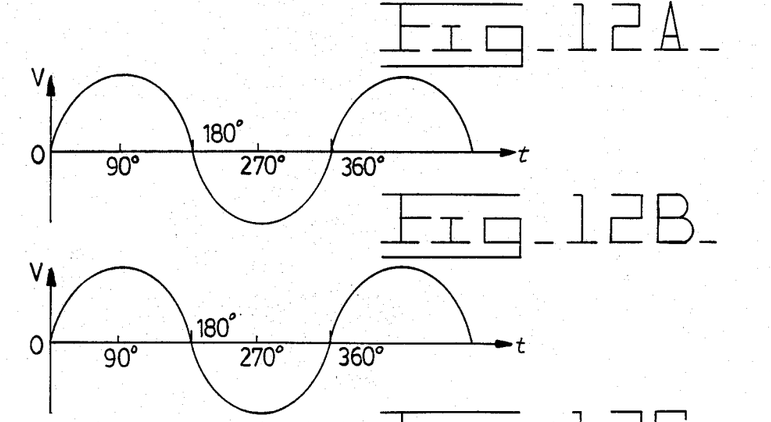
FIGS. 12A, 12B and 12C illustrate sample waveforms.

FIG. 9 is a schematic and functional block diagram of a preferred embodiment of the torque determining means 20. The alternating current from the driving means 22 is applied to the primary coils 30 to produce an alternating magnetic field adjacent the rotatable shaft 12, the magnetic field being a function of the torque applied to the shaft 12. As previously described, the secondary coils 32 are disposed on both sides of the primary coils 30. With this arrangement, the magnetic field adjacent the shaft 12 induces an amplitude modulated excitation signal into the secondary coils 32. With no stress in the shaft, magnetic flux distribution between adjacent primary coils 30 is symmetrical. Therefore, the two associated secondary coils 32 are positioned opposite the same equipotential line, as shown in FIG. 10A which results in the secondary flux and the secondary voltage being zero. With a stressed shaft, a voltage differential appears between the secondary coils 32 having clockwise structures and those having counterclockwise structures due to distortion in the magnetic flux distribution between adjacent primary coils 30, as shown in FIG. 10B. A differential amplifier 70 amplifies the voltage signal across the secondary coils 32. The waveform, shown in FIG. 12B, is an example of the type of voltage signal that a differential amplifier 70 receives. The waveform has no DC offset, and oscillates at the same preselected frequency as the induced alternating flux. This signal is amplified and sent to a synchronous detector 72. The synchronous detector 72 samples 90° of the waveform to detect the magnitude and direction of the torque on the shaft 12. The amplitude of the waveform is correlative to the magnitude of the torque on the shaft 12, while the sign of the waveform, positive or negative voltage, is correlative to the direction of the torque on the shaft 12. An output means 52, which may include additional filtering and amplification, passes a torque signal. The torque signal may be used by peripheral controls, monitors, and the like.

Figure 11:
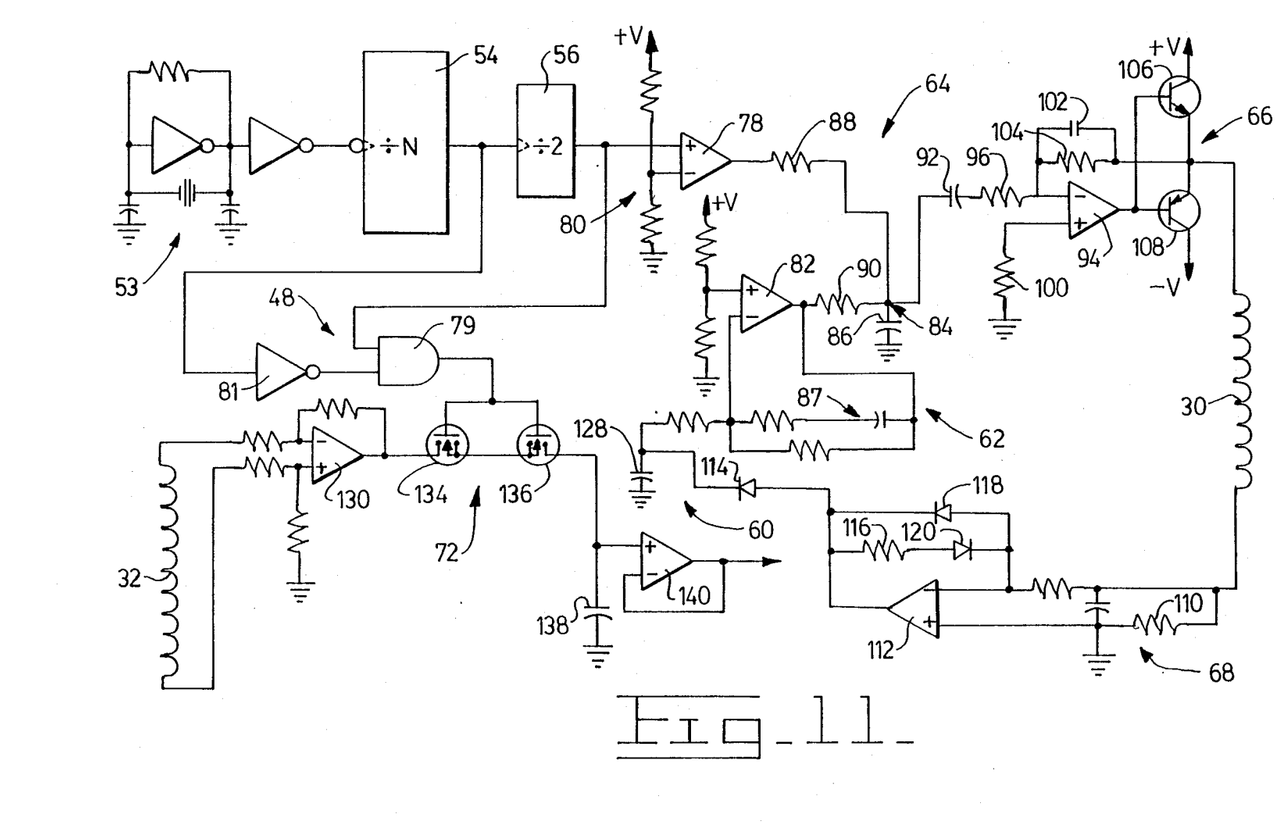
FIG. 11 is a schematic diagram of a processing circuit.

FIG. 11 is a schematic diagram of a circuit for the apparatus 10. The driver functions, torque determination functions, and output functions are all carried out by the circuit shown. It is understood that this is a preferred embodiment and that many other equivalent embodiments are possible without departing from the scope of the present invention. A crystal oscillator 53 produces a reference frequency of 1M Hz, for example. The divide-by-N circuit 54 reduces the frequency by a factor of N, while the divide-by-2 circuit 56 further halves the reference frequency. These need not be separate circuits, but in the preferred embodiment the two divide-by circuits 54,56 are convenient. If N=6, then the reference frequency of 1M Hz is reduced to 83.3K Hz at the output of the divide-by-2 circuit 56. The reduced reference frequency advantageously appears as a square wave at the output of the divide-by-2 circuit 56.

A comparator 78 receives the reduced reference frequency from the divide-by-2 circuit, and compares it to a preselected voltage developed by a voltage divider 80. The proportional integral controller 62, shown here to be an error amplifier 82, compares the current reference signal, Iref, to the sensed current signal from the primary coils 30, and produces an error signal in response to a difference between the compared signals. The current reference signal may be varied to compensate for a variety of possible problems, such as temperature drifting or calibration. Additionally the capacitor 87 enhances the response of the amplifier 82 by modifying the magnitude of the error signal in response to shifts in the magnitude of the sensed current signal. The error signal and the output of the comparator 78 impinge on a node 84, where the error signal amplitude modulates the reduced reference frequency signal. A filter 64, composed of a capacitor 86 and two resistors 88,90, converts the square wave to a roughly triangular waveform. When the output of comparator 78 is "low", i.e., when the reduced reference frequency signal is less than the preselected voltage, the capacitor 86 discharges through the resistors 88. The voltage across the capacitor 86 is dependent on the magnitude of the error signal and the gain of the proportional integral controller 62. When the output of the comparator 78 goes "high", the capacitor 86 charges through the resistor 90. The rate of charge is determined by the time constant which may be computed from the values of the capacitor 86 and the resistor 90. Since the capacitor 86 is charging for one half of the period of the reduced reference frequency and discharging for the other half, a triangular waveform appears across the capacitor 86.

A capacitor 92 filters DC components of the triangular waveform before it is applied to an amplifier 94 via resistor 96. The amplifier 94 adds more gain to the loop, and helps drive the primary coils 30. Additionally, an RC filter, composed of a capacitor 102 in parallel with a resistor 104, filters out high frequency components from the triangular waveform before delivery to the primary coils 30. A pair of transistors 106,108, connected in a "Class B" configuration, receive the triangular waveform and drive the primary coils 30. The voltage across the primary coils 30 roughly takes the appearance of a sine wave as shown in FIG. 12A.

The current sensor 68, shown here as a current sensing resistor 110, delivers a signal relative to the magnitude of the current flowing through the primary coils 30. The sensed current signal is buffered and half-wave rectified by an operational amplifier 112. A pair of diodes 114,120 provide temperature compensation, and the rectifying diode 118 prevents the amplifier 112 from saturating during negative peaks. The sensed current signal then passes to the peak detector 60, shown here as a capacitor 128. The capacitor 128 charges to a voltage correlative to the peak current through the primary coils 30. As the peak voltage changes, the capacitor 128 has enough internal leakage that the voltage across it varies as the voltage across the current sensing resistor 110 varies. Although more complex peak detectors could be used, they are not necessary. The sensed current signal is compared to the current reference signal as described earlier, so that the excitation of the primary coils 30 are controlled.

Figure 12C:
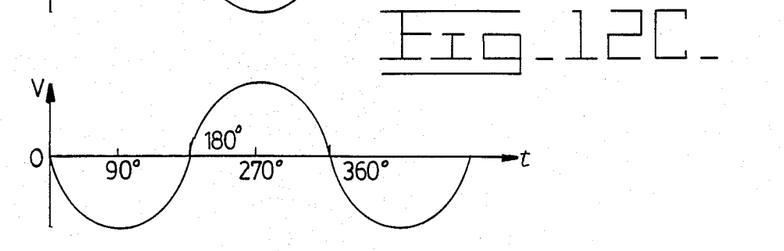

The torque determining means 20 receives signals from the secondary coils 32. The voltage across the secondary coils 32 roughly takes the appearance of a sine wave as shown in FIGS. 12B and 12C. A differential amplifier 130 amplifies the voltage differential on the secondary coils 32. A logic circuit 48 receives the outputs of the divide-by-N circuit 54 and the divide-by-2 circuit 56. The logic circuit 48, shown here as an AND gate 79 and an inverter 81, delivers a sampling signal for a 90° duration of the 83.3K Hz waveform. The synchronous detector 72 is shown here to include first and second FETs 134,136. The gates of the first and second FETs 134,136 are connected to the output of an AND gate 79. The sampling signal from the AND gate 79 turns the FETs 134,136 'ON' for a 90° cycle in order to sample the waveform from the differential amplifier 130. Referring to the waveforms of FIGS. 12B and 12C, the 90° sampling "window" is 'ON' from 90° to 180°, for example. The charge on a capacitor 138 develops a voltage correlative the sensed torque on the shaft 12. As stated previously, both the magnitude and direction of the torque are sensed. For example, a positive voltage may indicate a positive torque, as is shown in FIG. 12B, while a negative voltage may indicate a negative torque, as is shown in FIG. 12C. This is important since the drive shaft of a vehicle experiences positive torque during acceleration, and a negative torque during deceleration. An output means 52, shown here to be a voltage follower 140 delivers the sensed torque signal to peripheral controls, not shown. Additional gain can be added to the output means 52 to calibrate the torque signal for delivery to peripheral circuitry or controls.

Figure 13:
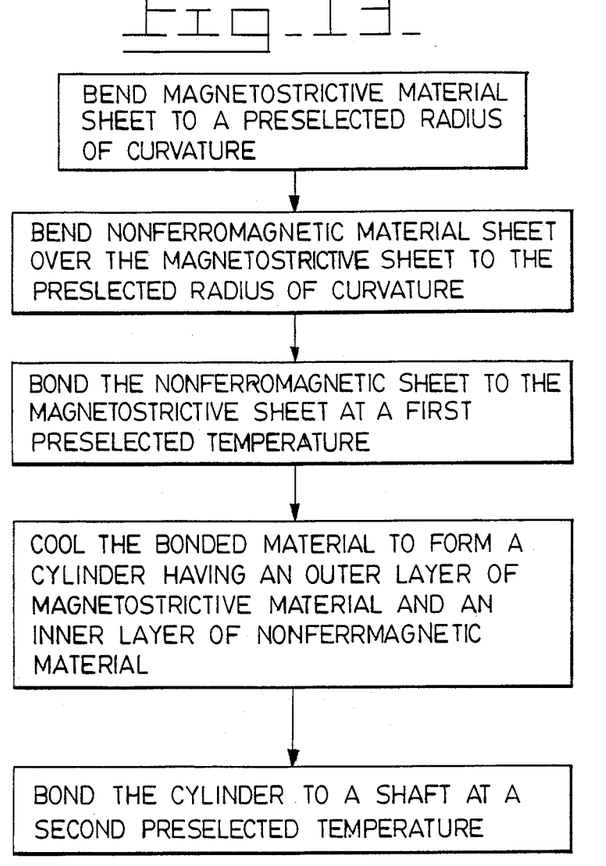
FIG. 13 is a block diagram of a method for bonding a magnetostrictive material sheet to a shaft.
Figure 14:
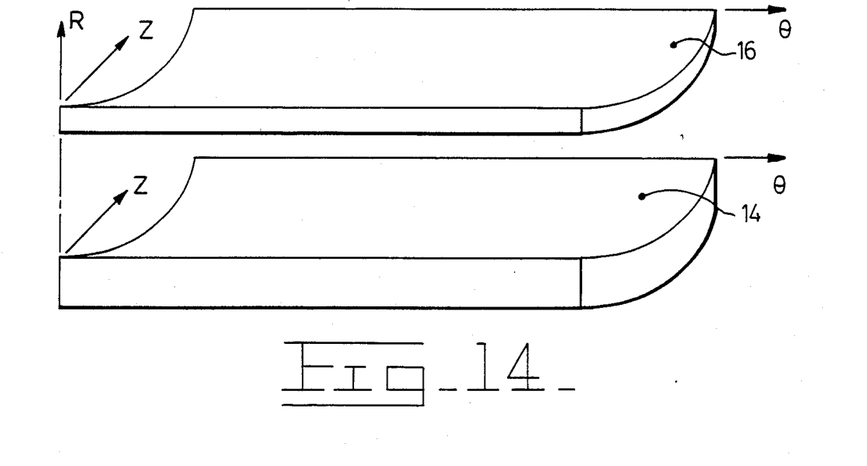
FIG. 14 illustrates an exploded view a magnetostrictive material sheet and a nonferromagnetic material sheet during bonding.
Figure 15:
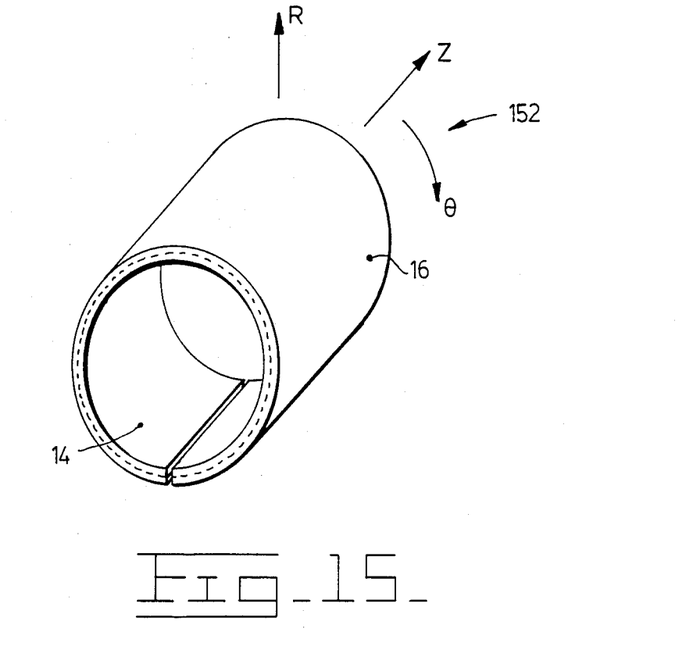
FIG. 15 illustrates a magnetostrictive material sheet and a nonferromagnetic material sheet after bonding and cooling.

FIGS. 13, 14, and 15 disclose a method for minimizing stress in the magnetostrictive material sheet 16. To further increase the accuracy and range of a torque sensor, a method minimizes stress in the magnetostrictive sheet 16. The magnetostrictive sheet 16 has zero average stress when flat. Any bending, twisting, tension, or pressure on the sheet 16 produces a stress in the material which causes its magnetic permeability to change. In addition, any temperature change during bonding of magnetostrictive material to a shaft induces further stresses due to different coefficients of thermal expansion of the magnetostrictive material and the shaft. Magnetostrictive material reaches saturation after a limited amount of stress. Therefore, since the bonding of magnetostrictive material to a nonplanar surface, such as a shaft, induces these prestresses, the useable range of the material is restricted. Moreover, the saturation limits due to inconsistent manufacturing may not be known for all samples, and further hinders accuracy. Henceforth, the method for minimizing prestress in the magnetostrictive material sheet 16 of a torque sensor greatly improves the sensor's range and accuracy.

FIG. 13 shows a flowchart depicting a method for bonding the torque sensor structure on a shaft while minimizing stress in the magnetostrictive sheet 16. A sheet of magnetostrictive material is bent to a preselected radius. Preferably, it is bent about a mandrel, or the like, which has the preselected radius of curvature. A sheet of nonferromagnetic material 14 is bent to the preselected radius over the magnetostrictive sheet 16, as shown in FIG. 14. The preselected radius is the desired radius of the resulting cylindrical structure. For instance, if the shaft has a diameter of four inches, the preselected radius is two inches. Preferably, the magnetostrictive sheet 16 is sold under the brand name METGLAS by Allied Chemical Corporation of Morristown, N.J. U.S.A., and the nonferromagnetic material sheet 14 is stainless steel. The bent sheets are bonded together at a first preselected temperature to form a bonded material layer. The first preselected temperature is selected based upon the coefficient of thermal expansion of the two sheets 14,16, the thickness of the two sheets 14,16, and the type, thickness, and solidification temperature of bonding material used. This will be described in detail with respect to the preferred materials mentioned above.

The two sheets 14,16 are bonded (as shown by the dashed line in FIG. 15) and subsequently cooled to form a cylinder 152 having an outer layer of magnetostrictive material 16 and an inner layer of nonferromagnetic material 14. If the coefficient of thermal expansion of the magnetostrictive material sheet 16 is lower than the coefficient of thermal expansion of the nonferromagnetic sheet 14, then as tee materials cool, the nonferromagnetic sheet 14 will shrink more than the magnetostrictive sheet 16. This causes the radius of curvature preformed on the mandrel to flatten out. Likewise, the O-axis of the bonded material sheet, which was along the mandrel, is bent by the shrinkage into a cylinder having a diameter corresponding to twice the radius of curvature. Now the magnetostrictive material sheet 16 experiences compressive forces and the nonferromagnetic sheet 14 experiences tensile forces.

Next, the cylinder of the bonded material is bonded to a shaft 12 at a second predetermined temperature. The second predetermined temperature is typically lower than the first predetermined temperature to preserve the strength of the first bond. As the cylinder is heated, the magnetostrictive sheet 16 experiences tensile forces, while the nonferromagnetic sheet 14 experiences compressive forces. When the final assembly cools to room temperature or a preselected operating temperature, the magnetostrictive material layer experiences a minimal average stress throughout its thickness. Proper selection of materials and bonding methods can reduce the stress to an average of zero.

For instance, in the preferred embodiment, a METGLAS sheet 16 having a thickness of about 0.001 inches is soldered at about 200° C. to a stainless steel sheet 14 having a thickness of about 0.002 inches. Solder layers having a thickness of about 0.002 inches are typical, but may vary depending on the type of solder, thicknesses of the sheets 14,16, and the coefficient of thermal expansion of the sheets. It is understood that a variety of different material thicknesses render acceptable results, and thus fall within the scope of the present invention. A uniform thickness of the bonding layer ordinarily produces the best results. Where solder is used as a bonding agent, a uniform pressure may be applied to the sheets 14,16 via a press on the mandrel to achieve uniform solder thickness throughout the bond. Since the solder temperatures are relatively low and METGLAS is susceptible to oxidation, soldering is preferably done in an oxygen free environment, such as a hot oil bath. First the METGLAS and the stainless steel are cleaned. The amount of solder required to render the desired bond thickness is applied to the stainless steel sheet 14. A preferred solder for the METGLAS to stainless steel bond contains about 5% to 35% tin and about 65% to 95% lead. The material sheets 14,16 with the solder between them are clamped to the mandrel with about 1 psi of pressure, and placed in the oil. The temperature of the oil melts the solder to form a bonded material sheet. The sheet cools once removed from the hot oil, and forms a cylinder. The cylinder and a shaft 12 are cleaned, and an amount of solder required to render the desired bond thickness is applied. A preferred solder for the bonded material sheet to shaft bond contains approximately equal portions of tin and lead. The cylinder is clamped onto the shaft 12, and placed in the oil bath. This soldering step is accomplished at a temperature of approximately 180° C. After the solder melts, the assembly is removed and a zero average prestrain exists in the METGLAS sheet 16 upon cooling.

Industrial Applicability

Torque sensing plays a crucial role in the development of electronic vehicle controls. Electronic controls monitor a vehicle's operating parameters to control a variety of functions, from simple maintenance control to autonomous control. However, vehicle applications require rugged sensors capable of withstanding severe environmental conditions. Many torque sensors function well in laboratory situations, and fail on vehicles. Moreover, electronic controls require accurate sensors. Typically, the accuracy of an electronic control is limited by the accuracy of associated sensors.

The method (FIG. 13) for bonding a magnetostrictive material sheet 16 to a shaft produces a rugged and accurate torque sensor. A strong adhesive or solder, along with proper application, provides a sturdy bond capable of performing well in a vehicle application. Applied torque stresses the shaft 12. The bonding material transfers the stress from the shaft 12 through the nonferromagnetic sheet 14. The bonding material between the nonferromagnetic sheet 14 and the magnetostrictive sheet 16 transfers the stress to the magnetostrictive sheet 16. As previously stated, the magnetic permeability of the magnetostrictive sheet 16 changes in response to stress. Minimization of stress in the construction of the assembly increases the accuracy and range of the torque sensor. An accurate and durable torque sensor results if a durable bonding material is used along with the method for minimizing stress in the magnetostrictive sheet 16. Furthermore, the nonferromagnetic sheet 14 limits flux penetration into the shaft 12, thus eliminating inaccuracies caused by ferromagnetic shafts.

An equally durable and accurate sensing structure may be used so that overall accuracy does not deteriorate. The sensing structure disclosed in the preferred form includes a flexible inductive coil structure. The primary coils 30 are disposed on each side of the flexible base sheet 34, and aligned with one another to provide a greater concentration of flux for application to the magnetostrictive material sheet 16. Likewise, the secondary coils 32 are disposed on each side of the flexible base sheet 34, and aligned with one another to provide better magnetic flux sensing capability. The greater the number of individual coils, the higher the accuracy of the sensing structure. To protect the coils from harsh vehicle environments, first and second flexible cover sheets 33,35 are bonded over the coils 30,32. Preferably, all of the sheets are impervious to vibration, oil, detergents, and other contaminants which might be present.

Additionally, mounting structure 36 is provided to secure the sensor structure on the vehicle. The mounting structure is durable and also effects the overall accuracy of the torque sensor. The tube 40 having no magnetic properties is concentrically disposed about the shaft 12 and provides a uniform gap for the sensor structure, which is disposed about the tube. A means secures the tube and sensor in the mounting structure. Preferably a strong, durable material, such as a potting compound is used.

The circuitry used in the preferred embodiment of the torque sensor further improves accuracy as described previously with regard to FIGS. 7, 8, 9 and 11. Heretofore, many aspects of torque sensing have been considered. The preferred embodiment of the torque sensor incorporates many useful features resulting from this consideration to produce an accurate and durable torque sensor.

In a vehicle application the torque sensor performs as follows. The nonferromagnetic sheet 14 and the magnetostrictive sheet 16 are bonded to the shaft whose torque is to be sensed. A coil structure surrounds the magnetostrictive sheet 16 on the shaft 12. The driving means 22 induces an alternating magnetic flux into the magnetostrictive sheet 16 via the primary coils 30. The nonferromagnetic sheet 14 substantially prevents the magnetic flux from entering the shaft 12. This provides a better signal for the sensing means 18, and prevents the shaft from interfering with the alternating magnetic flux. Secondary coils 32 sense the flux in the magnetostrictive sheet 16, and output the sensed flux to a torque determining means 20. Torque applied to the shaft transfers to the magnetostrictive sheet 16. As the magnetostrictive sheet 16 is stressed, its magnetic permeability changes, thus affecting the flux therein. The change in flux is sensed via the secondary coils 32. The torque determining means responds to the change in flux by monitoring the voltage induced in the secondary coils, which is related to the change in magnetic permeability of the magnetostrictive sheet 16, and outputs a signal indicative of the sensed torque on the shaft 12. The torque signal is used by peripheral controls and the like for vehicle monitoring or control.

Other aspects, objects, and advantages of the present invention may be obtained from a study of the drawings, the disclosure, and the appended claims.

We claim:

1. A method for bonding a magnetostrictive material sheet to a shaft while minimizing stress of the magnetostrictive sheet, comprising the steps of:
    conforming a magnetostrictive material sheet to a mandrel having a preselected radius of curvature;
    conforming a nonferromagnetic material sheet to said magnetostrictive material sheet on said mandrel;
    bonding said nonferromagnetic material sheet to said magnetostrictive material sheet at a first preselected temperature to form a bonded material sheet;
    cooling said bonded material sheet to form, upon cooling, a cylinder having an outer layer of magnetostrictive material and an inner layer of nonferromagnetic material; and
    bonding said cylinder to a cylindrical shaft at a second predetermined temperature.

2. The method, as set forth in claim 1, wherein said step of bonding said nonferromagnetic sheet to said magnetostrictive sheet includes:
    soldering said nonferromagnetic material sheet to said magnetostrictive material sheet at a first preselected temperature to form a bonded material sheet.

3. The method, as set forth in claim 1, wherein said step of bonding said cylinder includes:
    soldering said cylinder about a cylindrical shaft at a second predetermined temperature.

4. The method, as set forth in claim 1, wherein said second predetermined temperature is lower than said first predetermined temperature.

5. The method, as set forth in claim 1, wherein said magnetostrictive material has a coefficient of thermal expansion of a first value, and said nonferromagnetic material has a coefficient of thermal expansion of a second value, said first value being lower than said second value.

6. The method, as set forth in claim 1, wherein said first bonding step is performed submerged in a hot oil bath.

* * * * *